(12) United States Patent
Wu

(10) Patent No.: US 6,400,572 B1
(45) Date of Patent: Jun. 4, 2002

(54) FASTENER FOR A HEAT SINK

(75) Inventor: Chih-Chung Wu, Hualien Hsien (TW)

(73) Assignee: Cooler Master Co., Ltd., Taipei Hsien (TW)

( * ) Notice: Subject to any disclaimer, the term of this patent is extended or adjusted under 35 U.S.C. 154(b) by 0 days.

(21) Appl. No.: 09/772,368

(22) Filed: Jan. 30, 2001

(51) Int. Cl.7 .................................. H05K 7/20
(52) U.S. Cl. .................. 361/704; 361/710; 165/80.3; 174/16.3; 257/718; 257/727
(58) Field of Search ................... 361/702–704, 361/707, 709, 717, 719, 722; 165/80.3, 185; 174/16.3; 257/712, 713, 717–719, 722, 727; 24/457, 458, 459; 248/505, 510, 316.7; 411/352, 516, 522, 523

(56) References Cited

U.S. PATENT DOCUMENTS

| 5,542,468 A | * | 8/1996 | Lin | 165/80.3 |
|---|---|---|---|---|
| 5,570,271 A | * | 10/1996 | Lavochkin | 361/704 |
| 5,638,258 A | * | 6/1997 | Lin | 361/704 |
| 5,771,960 A | * | 6/1998 | Lin | 165/80.3 |
| 5,860,195 A | * | 1/1999 | Wang | 24/459 |
| 5,889,653 A | * | 3/1999 | Clemens et al. | 361/704 |
| 6,208,518 B1 | * | 3/2001 | Lee | 361/704 |

* cited by examiner

Primary Examiner—Boris L. Chervinsky
(74) Attorney, Agent, or Firm—Selitto, Behr & Kim

(57) ABSTRACT

A fastener for combining a heat sink with an integrated circuit comprises a lateral strip and a lever. The lateral strip has a main portion with a first end formed as a first buckle that defines an aperture and a second end formed as a link for pivotally connecting the lever. Two taps extend perpendicularly downward from the lateral strip. The lever has a bottom end formed as a second buckle that defines an opening. When the fastener is applied to the heat sink that contacts with an integrated circuit which is attached on an integrated circuit base, the first and second buckles clasp two hooks of the integrated circuit base hence the two taps tightly contact with the heat sink so as to enhance the heat dissipating efficiency.

1 Claim, 5 Drawing Sheets

FASTENER FOR A HEAT SINK

BACKGROUND OF THE INVENTION

1. Field of the Invention

The present invention relates to a fastener, and more particularly to a fastener which is applied to a heat sink for uniformly pressing the heat sink to an IC base so as to enhance the heat dissipating effect of the heat sink.

2. Description of Related Art

With reference to FIGS. 6 and 7, when an IC (Integrated Circuit) (50) attached on an IC base (52) is operating, it often generates a lot of heat and so a heat sink (54) is provided to dissipate the heat to avoid damage to the IC (50). In order to secure the heat sink (54) to the IC base (52), a fastener (40) is provided. When the heat sink (54) is tightly contacted with the IC (50), the heat easily dissipates to the heat sink (54) to obtain a good heat-dissipating effect.

The fastener (40) is substantially M-shaped when viewed from the side, wherein a press portion (42) is formed at a middle of the fastener (40). Two ends of the fastener (40) are respectively formed as a first bent end (44) and a second bent end (46). A first through hole (442) is defined in the first bent end (44) and a second through hole (462) is defined in the second bent end (46). When the fastener (40) is attached to the heat sink (54), the first bent end (44) is buckled with a hook (48) of the IC base (52) via the first through hole (442) and the second bent end (46) is buckled with a hook (48') of the IC base (52) via the second through hole (462). The press portion (42) extends downward to the heat sink (54) and abuts the heat sink (54), whereby the heat sink (54) is in complete contact with the IC base (52) so as to obtain heat dissipation.

For conveniently installing the fastener (40) to the heat sink (54), the lengths and inclinations of the first bent end (44) and the second bent end (46) of the fastener (40) are fabricated to be unequal. Although this kind of the fastener (40) is easy to install, it is difficult to fabricate. The pressure to the heat sink (54) also spread unevenly thus the heat dissipating effect is not optimum.

To overcome the shortcomings, the present invention tends to provide a fastener for a heat sink to mitigate and obviate the aforementioned problems.

SUMMARY OF THE INVENTION

The main objective of the invention tends to provide a fastener to a heat sink that tightly buckles the heat sink into an IC base so as to obtain an efficient heat dissipating effect.

Other objects, advantages and novel features of the invention will become more apparent from the following detailed description when taken in conjunction with the accompanying drawings.

DETAILED DESCRIPTION OF THE PREFERRED EMBODIMENT

Figure 1:
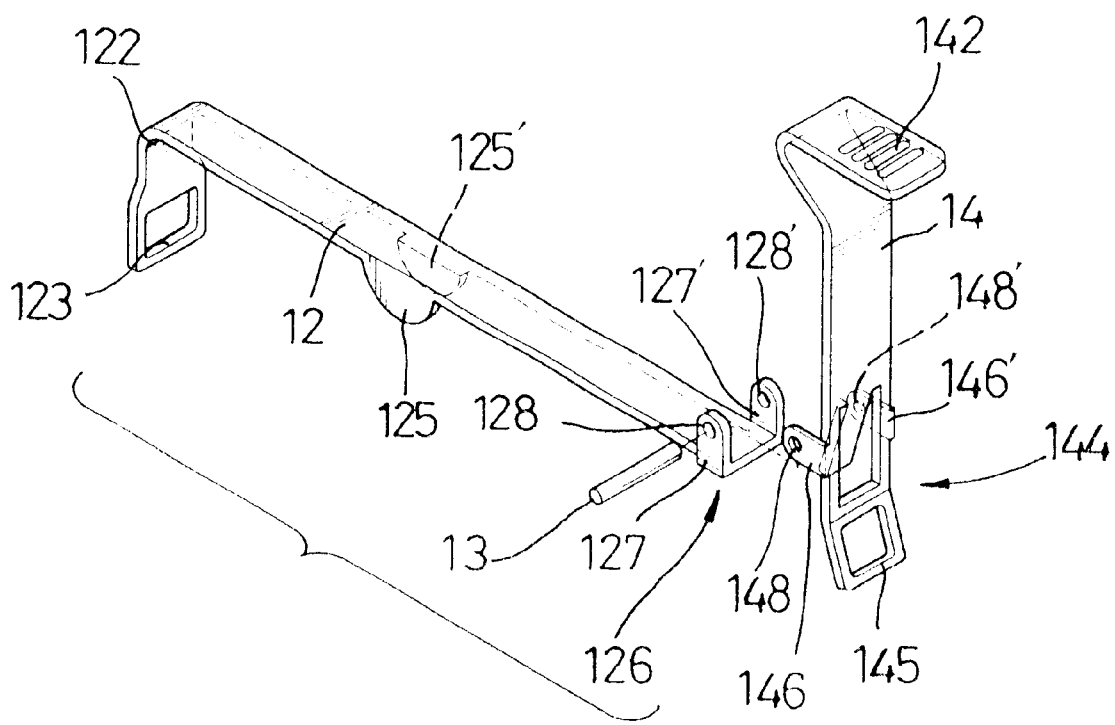
FIG. 1 is an exploded perspective view of a first embodiment of a fastener in accordance with the present invention.
Figure 2:
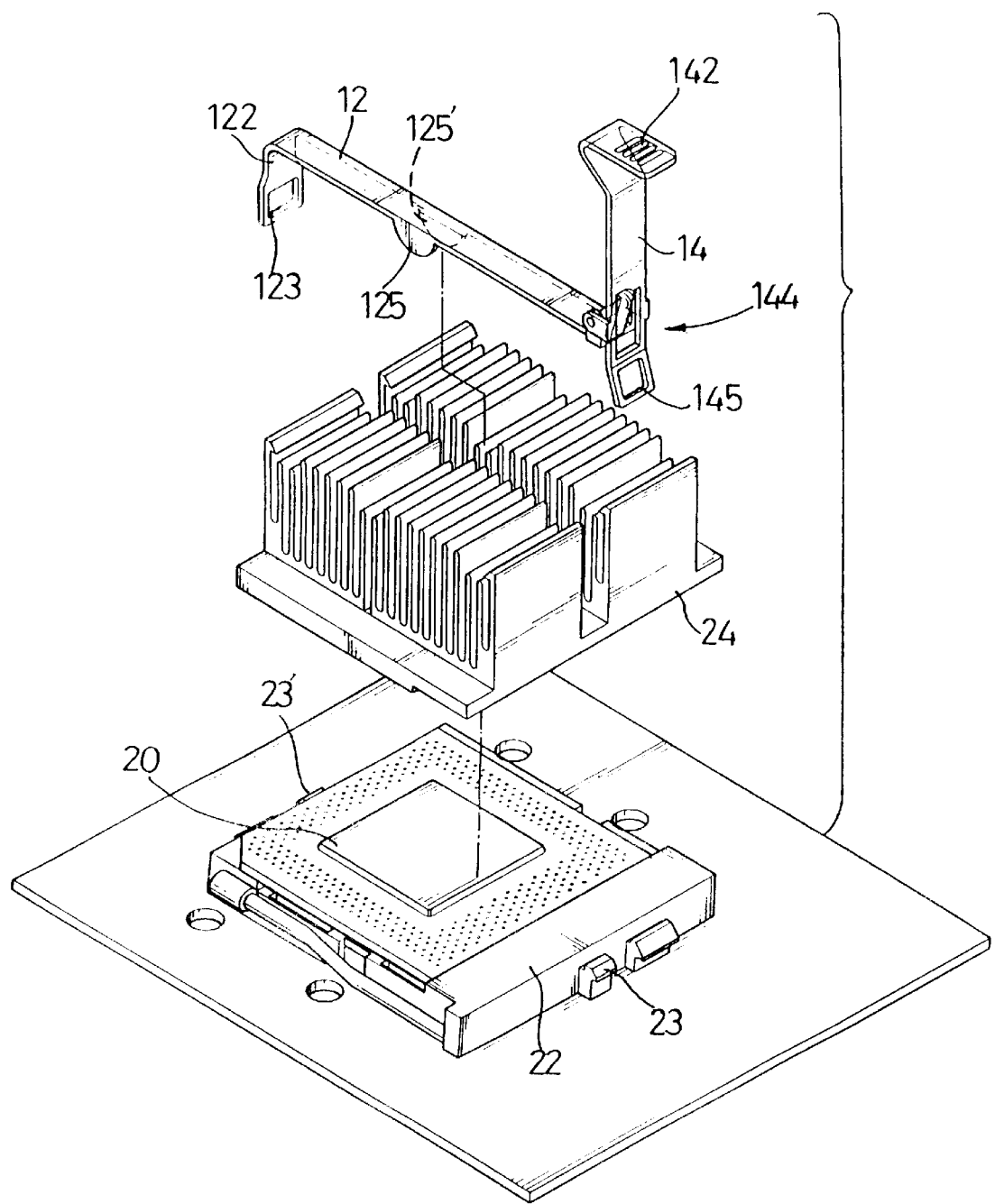
FIG. 2 is an exploded perspective view of the first embodiment of the fastener applied to a heat sink in accordance with the present invention.

With reference to FIGS. 1 and 2, a first embodiment of a fastener for combining a heat sink (22) with an integrated circuit (20) comprises a lateral strip (12) and a lever (14) pivotally attached to the lateral strip (12). The lateral strip (12) has a main portion with a first end formed as a first buckle (122) and a second end formed as a link (126). The first buckle (122) extends perpendicularly downward from the main portion and defines an aperture (123). The link (126) has two stubs (127 and 127') extending perpendicularly upward from the main portion, and each stub (127 and 127') defines a pivot hole (128 and 128'). The main portion of the lateral strip (12) has a pair of tabs (125 and 125') extending perpendicularly downward therefrom. In a preferred embodiment of the invention, the tabs (125) are substantially, though it is to be appreciated that other similar shapes are also practical.

Still referring to FIG. 1, the lever (14) has a top end formed as an operation platform (142), a bottom end formed as a second buckle (144), and a pivot portion comprising a pair of arms (146 and 146') formed between the top and bottom ends. The operation platform (142) extends in a direction substantially opposite to a direction of the arms (146 and 146'). The second buckle (144) has defined therein an opening (145) corresponding in size and shape to the aperture (123). The arms (146) each has defined therethrough a pin hole (148 and 148') corresponding to a respective one of the pivot holes (128 and 128'). A distance between outer faces of the arms (146 and 146') is slightly smaller than a distance between inner faces of the stubs (127 and 127'). A pin (13) is sized to extend between the stubs (127 and 127').

Figure 3:
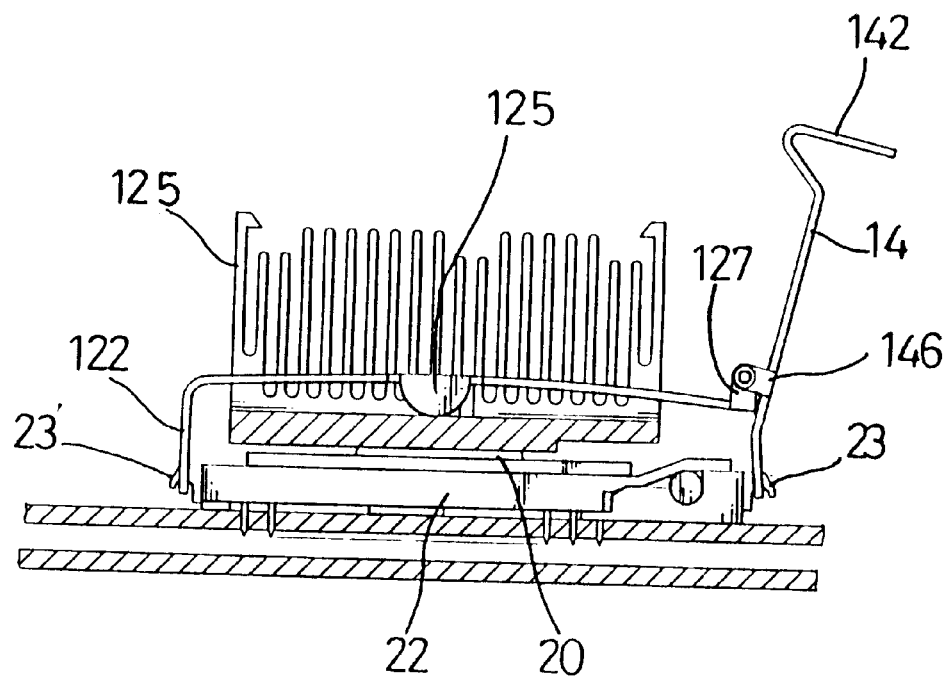
FIG. 3 is a perspective side view of the first embodiment of the fastener applied to the heat sink in accordance with the present invention.

In assembly, referring to FIGS. 1, 2 and 3, the arms (146 and 146') are received between the stubs (127 and 127'), and the pin (13) is inserted through the aligned pairs of pivot holes (128 and 128') and pin holes (148 and 148'), whereby the lateral strip (12) and the lever (14) are pivotally linked.

With reference to FIGS. 2 and 3, the fastener is applied to the heat sink (24) that contacts with the integrated circuit (20) that is attached on an integrated circuit base (22). A first hook (23') of the integrated circuit base (22) is securely extended through the aperture (123) of the first buckle, and a second hook (23) of the integrated circuit base (22) is extended through the opening (145) of the second buckle (144). When the first buckle (122) and the second buckle (144) clasp the hooks (23'and 23), the fastener is bent to form a slightly cambered shape and the two tabs (125 and 125') contact with the heat sink (24) so as to generate a force against the heat sink (24). By the force from the tabs (125 and 125'), the heat sink (24) tightly contacts with the integrated circuit (20) to achieve an optimum heat dissipating effect. To be more convenient to apply the fastener, the operation platform (142) is pressed so as to rotate the two arms (146 and 146') of the second buckle (144) hence the fastener is easily to be installed or removed from the heat sink (24).

Figure 4:
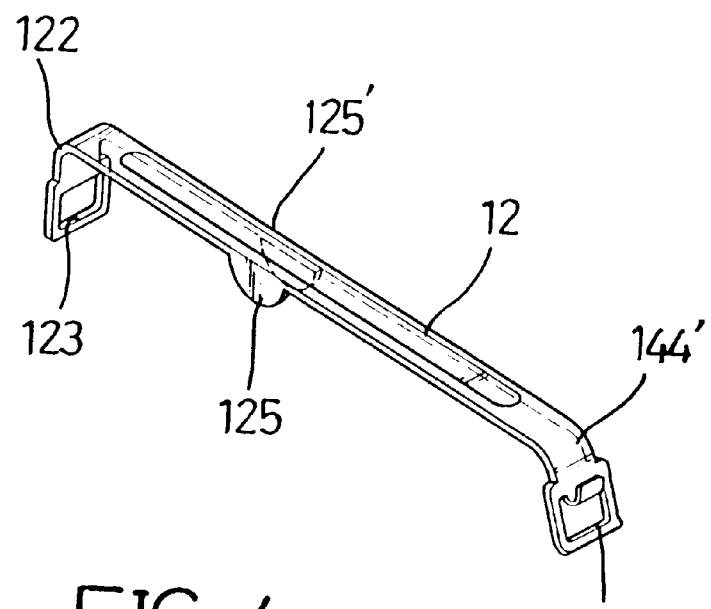
FIG. 4 is a perspective view of a second embodiment of the fastener in accordance with the present invention.

With reference to FIG. 4, a second embodiment of the fastener is shown, wherein the first buckle (122) and the second buckle (144) are integrally formed at the lateral strip (12), and the two tabs (125 and 125') are integrally formed at two opposed edges of the lateral strip (12) and extended perpendicularly downward. The aperture (123) and the opening (145) are correspondingly defined at the first buckle (122) and the second buckle (144).

Figure 5:
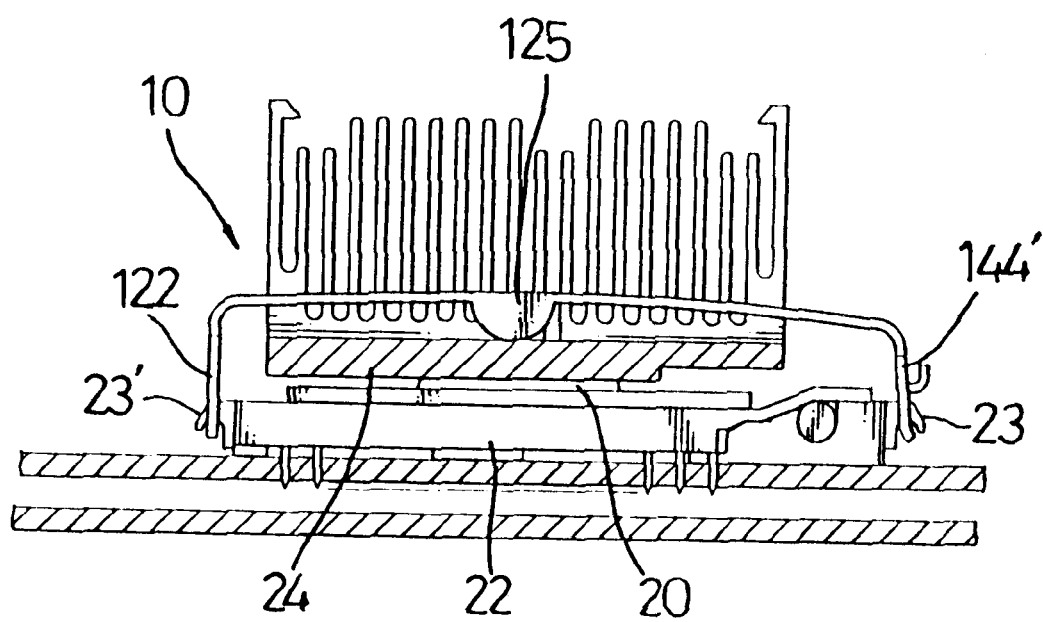
FIG. 5 is a perspective side view of the second embodiment of the fastener applied to the heat sink in accordance with the present invention.
Figure 6:
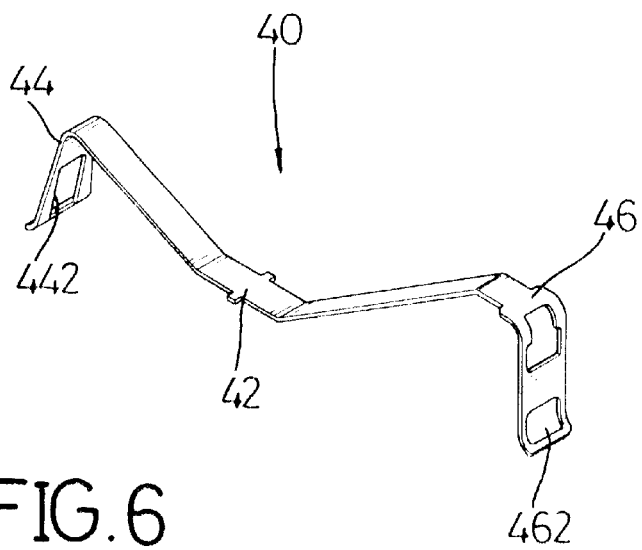
FIG. 6 is a perspective view of a conventional fastener.
Figure 7:
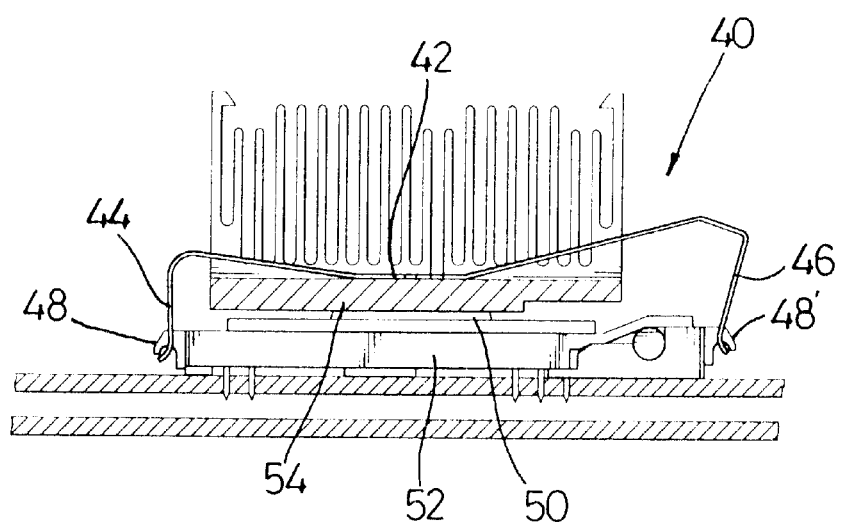
FIG. 7 is a perspective side view of the conventional fastener shown in FIG. 6 applied to the heat sink.

With reference to FIG. 5, the first buckle (122) clasps the first hook (23') of the integrated circuit base (22) and the second buckle (144) clasps the hook (23) of the integrated circuit base (22). The two tabs (125 and 125') contact with the heat sink (24) and generate a downward pressure thereto so the heat sink (24) tightly contacts the integrated circuit (20).

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink fastener for securing a heat sink onto an integrated circuit base, the heat sink fastener comprising:

a lateral strip having a first buckle formed to have an aperture being so defined in the first buckle that a first hook of the integrated circuit base is able to extend through the aperture and two tabs extending downward from the lateral strip for contacting with the heat sink; and a lever pivotally connected with the lateral strip via a link formed oppositely to the first buckle of the lateral strip and the lever having an operation platform formed at a top end of the lever and a second buckle formed at a bottom end of the lever for clasping the integrated circuit base, wherein an opening is defined in the second buckle so that a second hook of the integrated circuit base extends through the opening;

wherein when the operation platform is pressed, the heat sink fastener is installed on or removed from the heat sink.

* * * * *